US011290106B2

(12) United States Patent
Bramanti

(10) Patent No.: US 11,290,106 B2
(45) Date of Patent: Mar. 29, 2022

(54) LOW-POWER DIGITAL SIGNAL PROCESSING

(71) Applicant: STMicroelectronics S.r.l., Agrate Brianza (IT)

(72) Inventor: Alessandro Paolo Bramanti, Maglie (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 17/074,188

(22) Filed: Oct. 19, 2020

(65) Prior Publication Data

US 2021/0119630 A1  Apr. 22, 2021

Related U.S. Application Data

(60) Provisional application No. 62/923,918, filed on Oct. 21, 2019.

(51) Int. Cl.
*H03K 19/00* (2006.01)
*H03K 12/00* (2006.01)
*G06F 1/3234* (2019.01)

(52) U.S. Cl.
CPC ....... *H03K 19/0016* (2013.01); *G06F 1/3234* (2013.01); *H03K 12/00* (2013.01)

(58) Field of Classification Search
None
See application file for complete search history.

(56) References Cited

U.S. PATENT DOCUMENTS

| 4,359,772 | A | 11/1982 | Patel |
| 4,520,347 | A * | 5/1985 | Campbell, Jr. ......... H03M 7/04 341/93 |
| 5,148,161 | A * | 9/1992 | Sako ....................... H03M 7/24 341/93 |
| 5,247,524 | A | 9/1993 | Callon |
| 5,862,159 | A | 1/1999 | Seshan |
| 6,252,961 | B1 | 6/2001 | Hogan |
| 6,760,880 | B1 | 7/2004 | Ofek et al. |
| 7,039,134 | B1 * | 5/2006 | Avital .................... H04B 1/707 375/140 |
| 8,514,109 | B2 | 8/2013 | Chen et al. |
| 8,656,260 | B1 | 2/2014 | Barman et al. |

(Continued)

*Primary Examiner* — Jany Richardson
(74) *Attorney, Agent, or Firm* — Seed Intellectual Property Law Group LLP

(57) ABSTRACT

Systems and devices are provided to perform low-power digital filtering of sensor or other data based on bitwise operations. A reference sinusoid is encoded via a plurality of pulse trains, such that each pulse train includes a number of pulses n representing a value of the reference sinusoid out of a maximum possible pulses corresponding to an encoding quantization level. A circular register stores a representation of the encoded sinusoid. A set of multiple logical gate blocks are configured to multiply, via one or more bitwise operations, each of multiple bits of a received input signal with a pulse train corresponding to a value of the encoded sinusoid. A logic circuit coupled to the circular register and the set of multiple logical gate blocks is configured to generate, based on the encoded sinusoid and on the input signal, an output signal indicating an approximate value of the received input signal multiplied by the encoded sinusoid.

20 Claims, 6 Drawing Sheets

(56) References Cited

U.S. PATENT DOCUMENTS

| | | |
|---|---|---|
| 9,590,657 B2 | 3/2017 | Sedighi et al. |
| 2001/0023494 A1 | 9/2001 | Miyazaki et al. |
| 2017/0359082 A1 | 12/2017 | Riedel et al. |

* cited by examiner

LOW-POWER DIGITAL SIGNAL PROCESSING

BACKGROUND

Technical Field

The present disclosure generally relates to low-power digital signal processing. More particularly, but not exclusively, the present disclosure relates to use of bitwise operations to perform digital filtering of signal or other data.

Description of the Related Art

Mobile and wearable devices are already ubiquitous and the Internet of things (IoT) and coming 5G communications networks will only accelerate the growth of such devices. A typical mobile or wearable device includes sensors such as accelerometers and gyroscopes for movement analysis like pace counting and human activity recognition, as well as other types of sensors like microphones, proximity sensors, and so on. In operations, these sensors detect the corresponding parameter being sensed, such as acceleration or rotation, and generate a corresponding analog electrical signal having characteristics indicating the sensed parameter. This analog signal is then typically digitized and some type of post-processing performed on the digital signal, such as filtering, scaling, and so on.

The specific type of post-processing performed depends on the type of sensor. This post-processing must not, however, consume much electrical power since the corresponding mobile or wearable device is typically battery powered. Moreover, the sensors and corresponding mobile or wearable device must be physically small so as to be utilized unobtrusively in a variety of different types of environments. While conventional circuitry for performing this post-processing may be relatively simple, the power consumed by this circuitry is limited in mobile and wearable devices.

Common post-processing operations that must be performed on digital values of the digital signal from a sensor include frequency analysis and/or filtering of the digital signal. Such analysis may be performed via conventional circuitry, such as a microcontroller, but operations typically performed by such circuitry as part of such analysis may consume a relatively large amount of power. As a result, conventional circuitry for performing these operations may not be suitable for use in many mobile or wearable devices.

Thus, there is a need for digital circuitry to perform frequency-based analysis and filtering while consuming a relatively small amount of power, such as to enable the digital circuitry to be utilized in mobile and wearable devices.

BRIEF SUMMARY

Embodiments of the present disclosure are generally directed to devices and methods for performing low-power digital filtering of sensor or other data based on bitwise operations. In particular, techniques herein may include bitwise operations to generally effectuate narrow-band frequency analysis by locally approximating a Fourier transform in which a function to be transformed (such as an input signal) is multiplied by two sinusoids in quadrature with one another.

In an embodiment, a circuit may comprise a circular register configured to store a representation of a first encoded sinusoid; a set of multiple logical gate blocks that are each configured to multiply, via one or more bitwise operations, each of multiple bits of a received input signal with a pulse train corresponding to a value of the first encoded sinusoid; and a logic circuit coupled to the circular register and the set of multiple logical gate blocks. The logic circuit may be configured to generate, based on the first encoded sinusoid and on the input signal, an output signal indicating an approximate value of the received input signal multiplied by the first encoded sinusoid.

In one embodiment, a device may comprise one or more sensors that, in operation, generate a multi-bit sensor signal; one or more processors; and frequency analysis circuitry communicatively coupled to the one or more sensors and to the one or more processors. The frequency analysis circuitry may include a circular register configured to store a representation of a first encoded sinusoid; a set of multiple logical gate blocks that are each configured to multiply, via one or more bitwise operations, each of multiple bits of the multi-bit sensor signal with a pulse train corresponding to a value of the first encoded sinusoid; and a logic circuit coupled to the circular register and the set of multiple logical gate blocks. The logic circuit may be configured to generate, based on the first encoded sinusoid and on the multi-bit sensor signal, an output signal indicating an approximate value of the received input signal multiplied by the first encoded sinusoid.

In one embodiment, a method may comprise storing a representation of a first encoded sinusoid in a first circular register; multiplying, via one or more bitwise operations, each of multiple bits of a received input signal with a pulse train corresponding to a value of the first encoded sinusoid; and generating, based on the first encoded sinusoid and on the received input signal, an output signal indicating an approximate value of the received input signal multiplied by the first encoded sinusoid.

BRIEF DESCRIPTION OF THE SEVERAL VIEWS OF THE DRAWINGS

For a better understanding of the present disclosure, embodiments thereof are now described purely by way of non-limiting example, with reference to the attached drawings, wherein.

DETAILED DESCRIPTION

Figure 1:
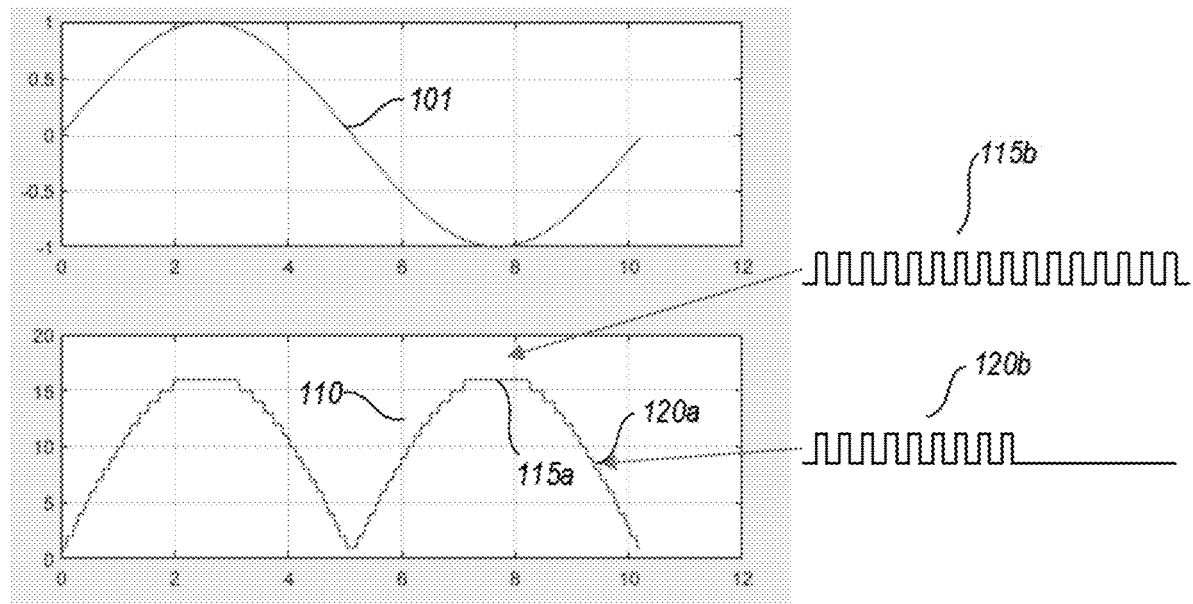
FIG. 1 graphically illustrates a possible encoding of a reference sinusoid for use in operations in accordance with the various techniques presented herein.

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, circuits, such as transistors, integrated circuits, logic gates, memories, interfaces, bus systems, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to." Reference to "at least one of" shall be construed to mean either or both the disjunctive and the inclusive, unless the context indicates otherwise.

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not necessarily intended to convey any information regarding the actual shape of particular elements, and have been selected solely for ease of recognition in the drawings.

Wearable devices and other mobile devices may include sensors, such as accelerometers or other sensors, that may be utilized in order to identify various aspects of user action and/or user-device interaction. For example, mobile device sensors may be used to identify particular activities in which a human user is engaged (e.g., running, walking, bicycling, swimming, or other activity), and/or to track qualitative or quantitative aspects of such activities (pace count, activity time, distance traveled, or other aspect). However, data provided by device sensors may typically require digital post-processing of that data (e.g., frequency analysis and/or filtering) in order to accomplish such activity tracking and identification.

Typical solutions for performing frequency filtering or other filtering operations of sensor data have involved digital filters that include use of non-bitwise operations such as addition, multiplication, and division. These non-bitwise operations may typically involve more computation cycles and other power-consuming resources than bitwise operations, and may consequently correspond to greater power usage than performing similar tasks using bitwise operations.

Techniques herein are generally directed to devices and methods for performing low-power digital filtering of sensor or other data based on bitwise operations. In particular, techniques herein may include bitwise operations to generally effectuate frequency analysis by approximating a Fourier transform in which a function to be transformed (such as an input signal) is multiplied by two sinusoids in quadrature with one another.

In certain embodiments, a received digital signal representing (as one example) sensor data may be encoded by effectively multiplying bit(s) of the signal with a quantized representation of a sinusoid, such that each weighted bit of the digital signal at instant t is encoded by n pulses out of a maximum m pulses in proportion to the value of the quantized sinusoid at instant t. For a multi-bit signal at instant t, this operation may be represented by a discrete integral as follows:

$$\sum_{i=0,1,\ldots n-1} b_i \cdot p \cdot 2^i$$

Where $b_i$ is the ith bit of the signal and p is a train of pulses representing the sinusoid value at instant t. By performing this discrete integral on the received digital signal with respect to each of first and second out-of-phase sinusoids, the desired Fourier transform is approximated via low-power bitwise operations.

FIG. 1 depicts an embodiment of a digital sinusoid 110 of a reference sinusoid 101. In the depicted embodiment, reference sinusoid 101 is quantized to generate the digital sinusoid 110 such that each of 16 possible magnitude values is represented by a series of n pulses out of a m maximum 16 pulses. In the depiction of FIG. 1, two examples of such encoding are depicted. At a peak 115a of digital sinusoid 110, the value of the digital sinusoid is encoded via square pulse train 115b, which includes 16 pulses out of the maximum of 16 possible pulses. In contrast, at an intermediate value of the digital sinusoid at 120a, the value of the digital sinusoid is encoded via square pulse train 120b, which includes 9 pulses out of the maximum of 16 possible. It will be appreciated that a variety of encoding pulse trains or other encoding for values of the digital sinusoid 110 may be utilized. In addition, other degrees of quantization of the reference sinusoid 101 (such as values greater or lesser than the exemplary value of 16) may be selected.

Figure 2:
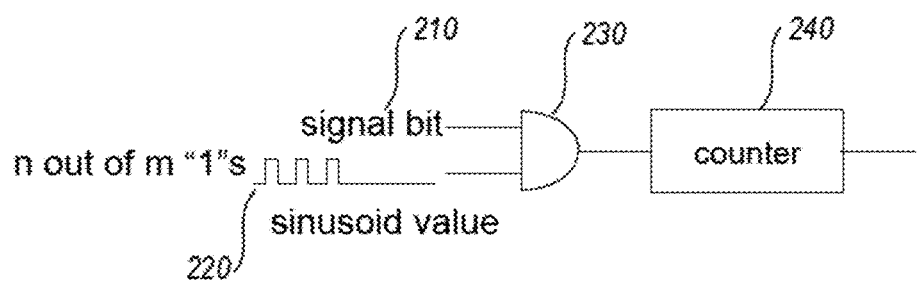
FIG. 2 is a functional block diagram illustrating the use of an encoded digital sinusoid for operations on a digital signal in accordance with one or more embodiments of techniques presented herein.

FIG. 2 depicts a block representation of the encoding of a signal bit in accordance with techniques described herein. In particular, a signal bit 210 received at instant t is combined via a digital logic AND gate 230 with a pulse train 220 that, in a manner similar to that described above with respect to FIG. 1, the n pulses of pulse train 220 out of a maximum of m possible pulses proportionally represents a magnitude at instant t of a quantized reference sinusoid. The output of the AND gate 230 is provided to a counter 240. Once the pulse train 220 has been input to the counter, the counter has counted n pulses if the signal bit is high (logical 1) or zero pulses if the signal bit is low (logical 0). It will be appreciated that this operation is equivalent to multiplying the signal bit 210 by the pulse train 220, accounting for a normalization factor of m pulses in accordance with the quantized reference sinusoid at its maximum magnitude.

To describe the functionality of counter 240 in a scenario involving a multi-bit signal, it may be useful to envision a metaphorical abacus. Assume that the abacus has multiple rods that each correspond to one bit position of a multi-bit signal, from the least-significant bit (LSB) to the most-significant bit (MSB), and that each abacus rod other than the MSB rod has a maximum quantity of beads it can accept. Each time the output of combining a signal bit and a corresponding pulse train (such as via AND logic gate 230) is a "1," a bead is added to the abacus rod corresponding to the significance position of the signal bit. For abacus rods other than the MSB abacus rod, when the maximum quantity of beads for the abacus rod is exceeded, the abacus rods in upper higher-significance positions are incremented accordingly; for the MSB abacus rod, beads accumulate accordingly.

To effectuate the desired counter, the abacus is made binary: each position has either 0 or 1 bead, with the exception of the MSB abacus rod (the bead capacity of which is effectively unlimited). Each abacus rod other than the MSB abacus rod may therefore be represented by a flip-flop. In this manner, each incoming bit of a multi-bit signal, encoded via a proportional pulse train, may affect the flip-flop corresponding to the significance position of that incoming bit, as well as propagating changes to higher-significance flip-flops and the MSB counter. As the abacus rods—now embodied as binary flip-flops—propagate changes from lower and intermediate bits to the MSB counter, the result of beads accumulating on the MSB counter is effectively multiplication (via the ANDing of the multi-bit signal with the clock pulses of the encoded sinusoid) and integration (via the accrued addition of beads over time) of the encoded signal to the MSB counter.

In certain embodiments, the MSB counter itself may be implemented via a series of flip-flops, such that flip-flops of the MSB counter and those flip-flops corresponding to lower-significance positions may together comprise a bitwise counter that may be updated by operations affecting intermediate bits rather than only its least-significant bit.

As depicted, the digital sinusoid 110 of FIG. 1 represents only magnitude values of the reference sinusoid 101. In certain implementations, therefore, a counter in accordance with the hypothetical abacus described above may designed as a bidirectional (also known as "up/down") counter, such that the digital sinusoid 110 representing reference sinusoid 101 further includes a sign bit. In various embodiments, circuitry to effectuate a bitwise counter may include circuitry to avoid unwanted two's complement behavior with respect to values of the digital sinusoid 110. One such non-limiting embodiment is described below with respect to FIGS. 3-5.

Figure 3:
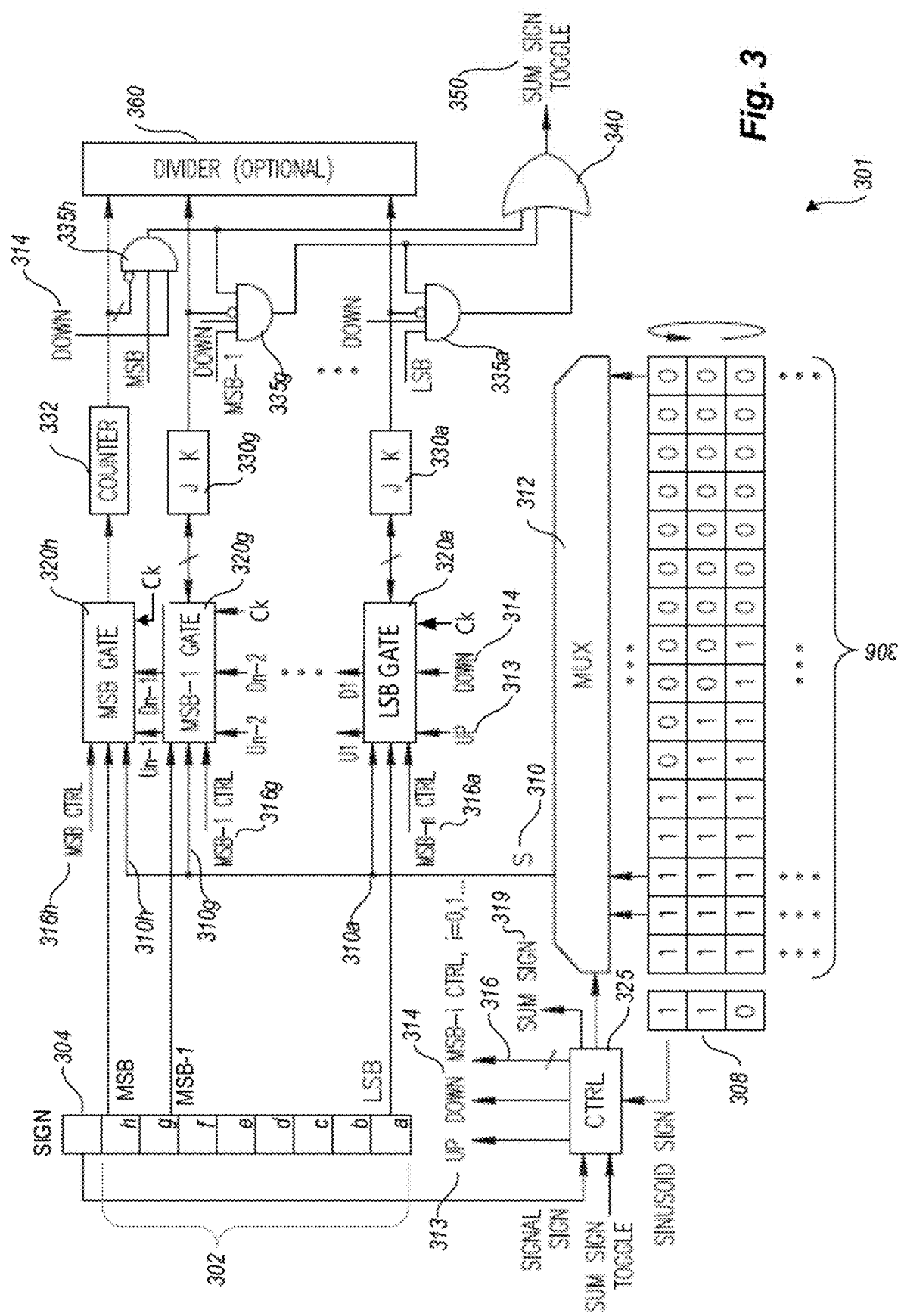
FIG. 3 is a partial schematic diagram of a digital frequency filter using bitwise operations in accordance with one or more embodiments of techniques presented herein.

FIG. 3 is a partial logical schematic diagram of a digital frequency filter 301 using bitwise operations. A multi-bit input signal 302 comprises eight individual bits 302a-h, which include least-significant bit (LSB) 302a through most-significant bit (MSB) 302h, and further comprises sign bit 304. Signed values corresponding to an encoded digital sinusoid are stored via a circular register 306 (each row of which contains an instant magnitude of the digital sinusoid as encoded via proportional pulse trains, in accordance with operations described with respect to FIG. 1) and corresponding circular sign register 308. It will be appreciated that in the depicted embodiment, circular register 306 stores encoded trains of pulses as sequences of one-bit values, rather than digits with positional weights. During operation, multiplexer 312 provides output "S" 310 (the pulse trains indicating magnitude values of the encoded digital sinusoid) as the highest row of the register in a circular manner.

Figure 4:
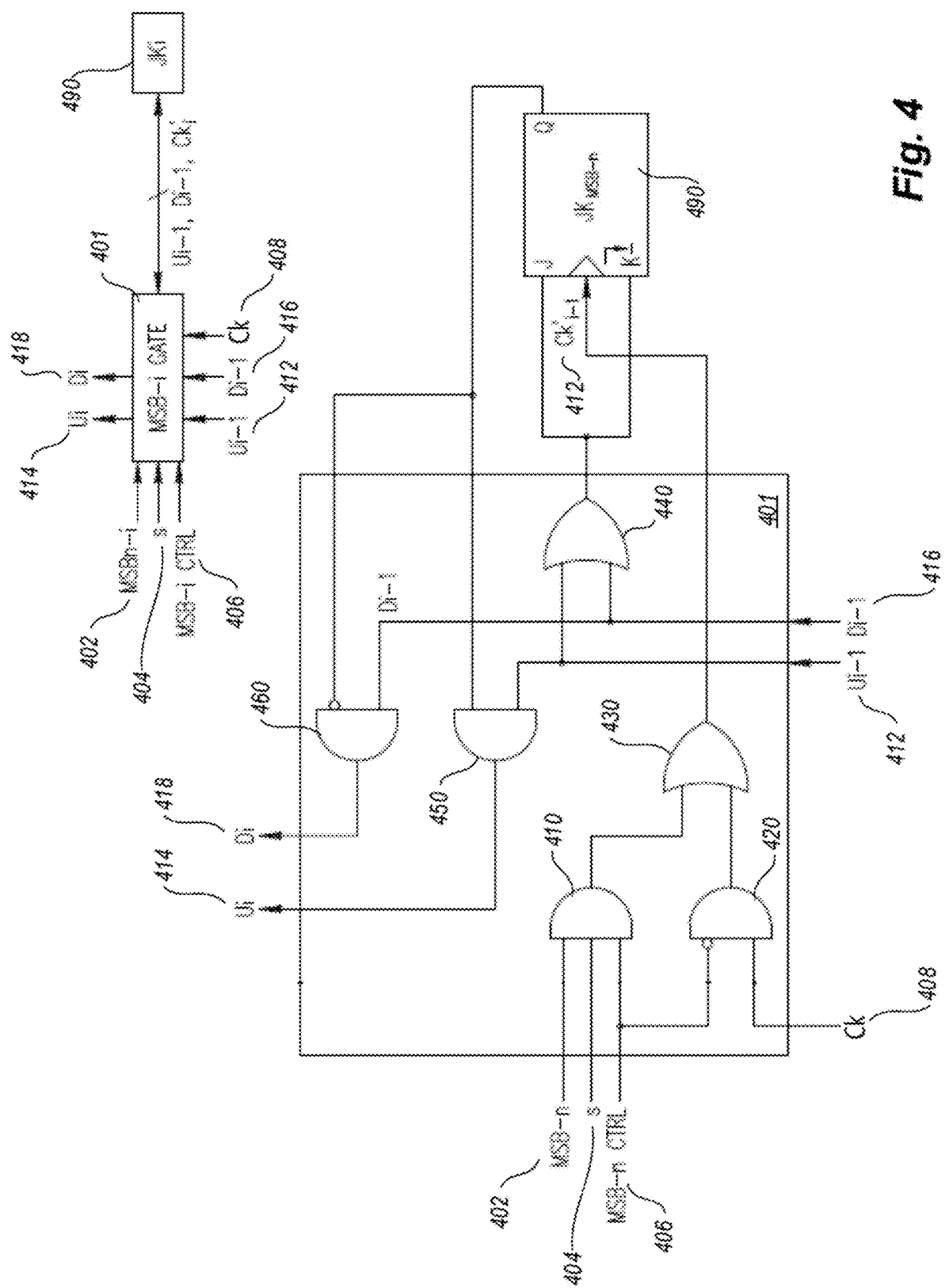
FIG. 4 is a more detailed schematic diagram of one embodiment of a gate block as utilized in the digital frequency filter partially depicted in FIG. 3.

In the depicted embodiment, during operation each bit of input signal 302 is provided to a corresponding one of gate blocks 320a-h (described in greater detail with respect to FIG. 4 elsewhere herein). Each of gate blocks 320a-h is also provided with a system clock signal, a single bit 310 of the encoded digital sinusoid at a time via circular register 306 and output "S" 310 of multiplexer 312. For example, the LSB bit 302a is provided to LSB gate block 320a, which ANDs the LSB bit 302a with a pulse train from circular register 306, including to propagate any resulting changes to neighboring LSB+1 gate block (not shown) via directional control signals U1 and D1; MSB−1 bit 302g is provided to MSB−1 gate block 320g, which ANDs the MSB−1 bit 302g with the same pulse train from circular register 306, including to propagate any resulting changes to neighboring MSB gate block 320h via directional control signals U1 and D1; and MSB bit 302h is provided to MSB gate block 320h, which ANDs the MSB bit 302h with the same pulse train from circular register 306. Thus, in the depicted embodiment, each bit of the multi-bit input signal 302 is separately and sequentially ANDed with an identical train of pulses.

Figure 5:
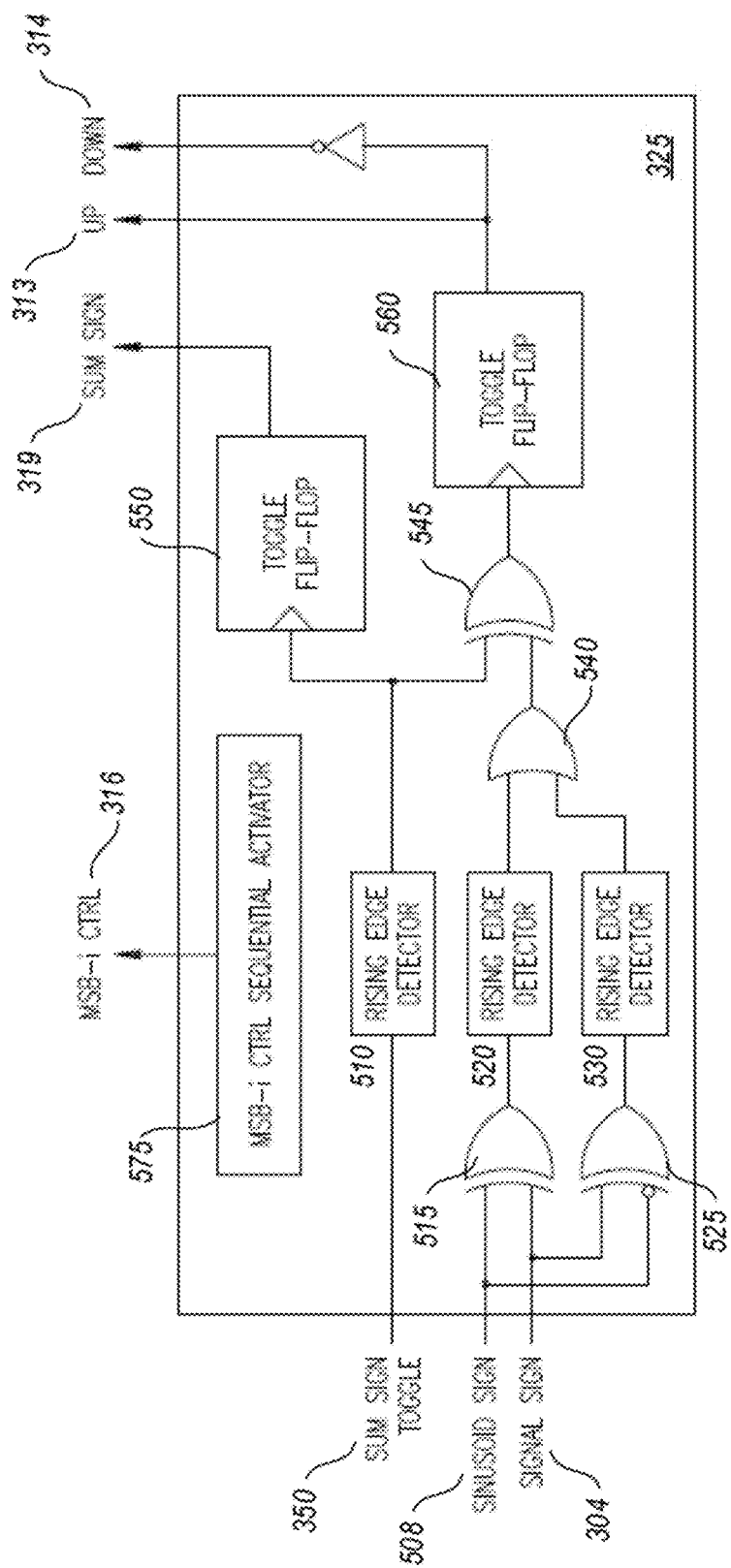
FIG. 5 is a more detailed schematic diagram of one embodiment of a sign control block as utilized in the digital frequency filter partially depicted in FIG. 3.

Also in the depicted embodiment of FIG. 3, the digital frequency filter 301 includes sign control block 325 ("CTRL"), which is described in greater detail with respect to FIG. 5 elsewhere herein. In operation, the sign control block 325 receives sign bit 304 of the multi-bit input signal 302, the output of circular sign register 308, and "sum sign toggle" output 350, and provides "up" directional control signal 313 and "down" directional control signal 314 to LSB gate block 320a. In addition, in operation sign control block 325 outputs a multi-bit CTRL signal 316 such that each of gate blocks 320a-h is provided with a corresponding bit of CTRL signal 316. For example, LSB CTRL bit 316a ("MSB-n CTRL") is provided to LSB gate block 320a; MSB−1 CTRL bit 316g is provided to MSB−1 gate block 320g; and MSB CTRL bit 316h is provided to MSB gate block 320h.

Thus, in the depicted embodiment, during operation each of the gate blocks 320a-h receives input that includes a single bit of multi-bit input signal 302; a pulse train corresponding to a bit-row encoding the magnitude of the digital sinusoid, as provided via output S 310 of multiplexer 312; directional "up" and "down" control signals, either propagated from the neighboring gate block or (for LSB gate block 320a) received from sign control block 325; and a system clock signal.

Continuing with the depicted embodiment of FIG. 3, digital counter 332 comprises a bidirectional multi-bit counter constructed in a known manner, such as via multiple JK-type or other flip-flops. In operation, and as described in greater detail with respect to FIG. 4 below, digital counter 332 receives an up/down directional control signal derived from $U_{n-1}$ and $D_{n-1}$ provided by MSB gate block 320h, as well as a derived clock signal.

As noted above, in operation each of the gate blocks 320a-g (all of the gate blocks aside from the MSB gate block 320h) propagates directional ("up" and "down") and clock outputs to the neighboring gate block corresponding to the immediately higher-significance bit of multi-bit input signal 302. In addition, each of gate blocks 320a-g provides output to a corresponding JK flip-flop 330a-g. In particular, and as described in greater detail elsewhere herein with respect to FIG. 4, each of the JK flip-flops 330a-g and digital counter 332 provides an inverted output to a corresponding digital logic AND gate 335a-h, and in the depicted embodiment provides a non-inverted output to a divider 360.

In the depicted embodiment, each of AND gates 335a-h receives a first input comprising the inverted output of a corresponding JK flip-flop 330a-h, a second input comprising the "down" directional control signal of sign control block 325, and a third input comprising a corresponding bit of multi-bit input signal 302. In addition, each of the digital logic AND gates 335a-g (all but AND gate 335h, which corresponds to the MSB gate block) receives a fourth input from the output of the AND gate 335 corresponding to the neighboring higher-bit-significance gate block. For example, AND gate 335g receives an inverted input from JK flip-flop 330g, the "down" directional control signal from sign control block 325, MSB−1 signal bit 302g, and the output of digital logic AND gate 335h.

The output of the digital logic AND gates 335a-h are all provided as input to digital logic OR gate 340. In this manner, digital logic AND gates 335a-h, cascaded together and provided with both the output of a corresponding JK flip-flop and the "down" directional control signal of sign control block 325, are used to detect a need to change a sign of the sum via output 350 ("SUM SIGN TOGGLE"), which is provided as an input to sign control block 325.

In the depicted embodiment, optional divider 360 is used to divide the final value of the performed integral—as provided via gate blocks 320 and JK flip-flops 330—by a compensating factor equal to the number of points considered in the integration (the quantity of samples per period of the digital sinusoid) multiplied by the quantity of pulses used to encode the digital sinusoid. For example, in the depicted embodiment, the sampling rate of multi-bit input signal 302 was selected as 25 samples per second, and the quantity of pulses used to encode the digital sinusoid was selected as 16. In certain embodiments, normalization with respect to the quantity of pulses per period, where such quantity is $2^p$, may be accomplished by discarding the p least significant bits in the multi-bit value provided to divider 360.

FIG. 4 is a more detailed schematic diagram of one embodiment of a gate block (such as any of gate blocks 320a-h) as utilized in the digital frequency filter partially depicted in FIG. 3.

In the illustrated embodiment of FIG. 4, a gate block 401 accepts via a digital logic AND gate 410 the inputs of a MSB-n input signal bit 402, an encoded digital sinusoid bit "s" 404, and a MSB-n CTRL signal bit 406, each of which is described in greater detail with respect to FIG. 3 above. A digital logic AND gate 420 receives an inverted MSB-n CTRL signal bit 406 and a system clock signal 408 (Ck). The respective outputs of AND gate 410 and AND gate 420 are provided to a digital logic OR gate 430, which in turn provides a derived clock signal 412 (Ck') to JK flip-flop 490. In operation, when input signal bit 402 (MSB-n) is logical high, it is counted as many times as the respective pulse train of encoded digital sinusoid bit "s" 404 is high—thus, as described elsewhere herein, effectively multiplies the input signal bit by the encoded sinusoid.

Also in the illustrated embodiment of FIG. 4, the gate block 401 accepts via a digital logic OR gate 440 a first input of an "up" directional control signal 412 ($U_{i-1}$) and a second input of a "down" directional control signal 416 ($D_{i-1}$), such as (with reference to FIG. 3) may be received from a neighboring gate block corresponding to a lower-significance bit position of the received input signal 302, or (in the case of LSB gate block 320a) from sign control block 325. The OR gate 440 provides its output signal to the J and K inputs of a JK flip-flop 490 that is external to the gate block 401. The "up" directional control signal 412 is provided as a first input to a digital logic AND gate 450, which receives as its second input a signal from the Q output of JK flip-flop 490, and which provides its output as propagated "up" directional control signal 414 ($U_i$). The "down" directional control signal 414 is provided as a first input to a digital logic AND gate 460, which receives as its second input an inverted signal from the Q output of JK flip-flop 490, and which provides its output as propagated "down" directional control signal 418 ($D_i$).

FIG. 5 is a more detailed schematic diagram of one embodiment of sign control block 325, as utilized by the digital frequency filter partially depicted in FIG. 3.

In the illustrated embodiment of FIG. 5, a first rising edge detector 510 receives as input sum sign toggle control signal 350 (as described elsewhere with respect to FIG. 3), and provides output to a first toggle flip-flop 550 and as the first input of a digital logic XOR gate 545. In the depicted embodiment, rising edge detectors issue a short 0→1→0 pulse, which can activate a toggle commanded on any edge. The toggle flip-flop 550 provides its output as the sum sign output 319 of the sign control block 325. A first digital logic XOR gate 515 receives as a first input the sinusoid sign signal 508 (such as that provided via circular sign register 308 of FIG. 3), receives as a second input sign bit 304 (of multi-bit input signal 302 from FIG. 3), and is coupled to provide input to a second rising edge detector 520. A second digital logic XOR gate 525 receives as a first input an inverted sinusoid sign signal 508, receives as a second input the sign bit 304, and is coupled to provide input to a third rising edge detector 530. Output from each of rising edge detectors 520 and 530 are provided as inputs to a digital logic OR gate 540, which is coupled to the second input of digital logic XOR gate 545. In turn, the digital logic XOR gate 545 provides the input to coupled toggle flip-flop 560. The output of toggle flip-flop 560 is output from sign control block 325 as "up" directional control signal 313; the inverted output of the toggle flip-flop 560 is output from the sign control block 325 as "down" directional control signal 314.

The sign control block 325 further includes a sequential activator 575, which provides the MSB-i CTRL signal 316 as output from the sign control block. In at least the depicted embodiment, sequential activator 575 may comprise a "straight ring counter" constructed in a known manner, such that the quantity of outputs is equal to the bit-width n of multi-bit input signal 302. Thus, for a multi-bit input signal comprising an n equal to 8 bits, sequential activator 575 first provides MSB-i CTRL output signal 316 as "10000000," followed by "01000000," "00100000," and so on. Sequential activator 575 may be clocked at an appropriate frequency that is at least n times the input frequency (such as in order to ensure that the ANDing of each bit with a pulse train from circular register 306 is integrated prior to modifying the MSB-i CTRL output signal 316), but at least m times smaller than the pulse train frequency (where m is the maximum number of pulses encoding each magnitude bit of encoded digital sinusoid, which corresponds to the bit-width of circular register 306).

Figure 6:
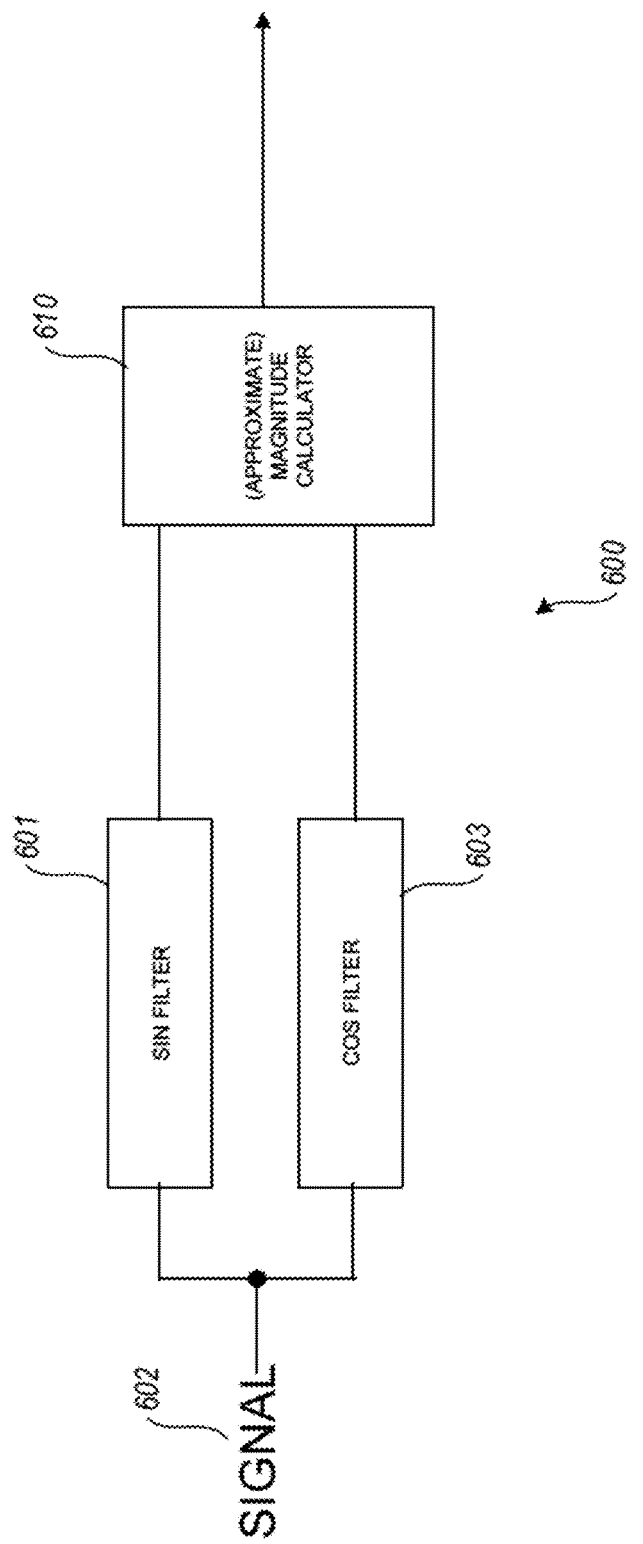
FIG. 6 is a schematic diagram of a digital frequency filter using bitwise operations in accordance with one or more embodiments of techniques presented herein.

FIG. 6 is a schematic diagram of a digital frequency filter 600 using bitwise operations in accordance with one or more embodiments of techniques presented herein. As noted elsewhere herein, a Fourier transform used for frequency analysis involves multiplying a function by two sinusoids in quadrature with one another. In the embodiment described with respect to FIG. 3, frequency filter 301 effectively integrates the multiplication of an input signal 302 with a single encoded sinusoid stored via circular register 306 and circular sign register 308. Thus, the depicted embodiment of a digital frequency filter 600 includes a first frequency filter 601 to integrate the multiplication of an input signal 602 by a first encoded sinusoid (such as an encoded sine wave), and includes a second frequency filter 603 to multiply the input signal 602 by a second encoded sinusoid (such as an encoded cosine wave). In at least certain embodiments, the two encoded sinusoids may be selected to have an identical frequency but differing in phase. As one non-limiting example, in operation and in the depicted embodiment of FIG. 6, sine filter 601 and cosine filter 603 each integrate the multiplication of input signal 602 by respective encoded sinusoids that are 90° out of phase with one another. In certain embodiments, the sign filter 601 and cosine filter 603 may share one or more circuitry elements, such as to share one or more circular registers for the purpose of storing a single encoded sinusoid that is used (in accordance with a selected phase difference) by both filters.

In the depicted embodiment, the respective outputs of sine filter 601 and cosine filter 603 are provided to a magnitude calculator 610 that, following one or more periods of the corresponding sinusoid, may sample or otherwise calculate the magnitude of the spectrum corresponding input signal 602. In certain embodiments, the magnitude calculator 610 may exploit approximate calculation techniques, such as to utilize lookup tables, for lower power consumption.

Figure 7:
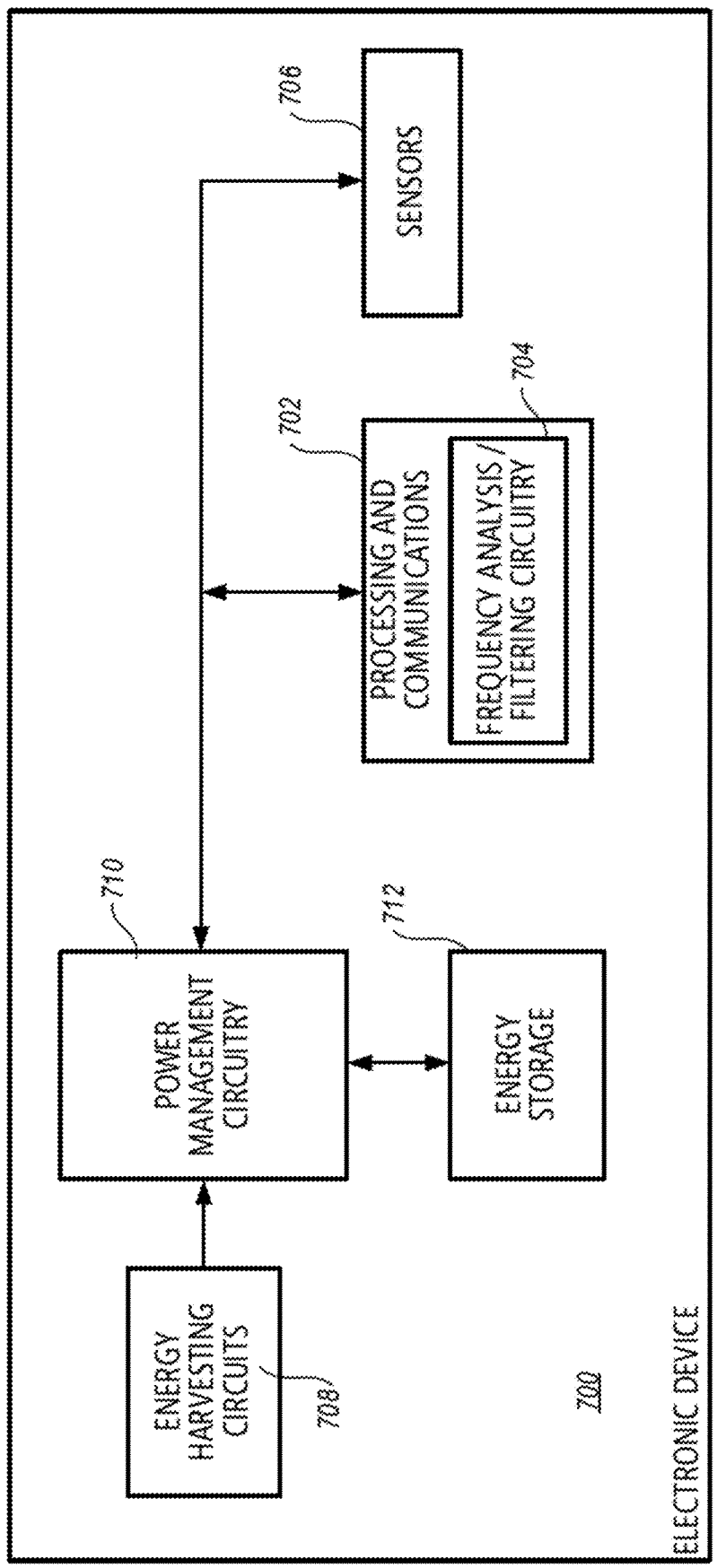
FIG. 7 is a functional block diagram of an electronic device that includes the digital frequency filter partially depicted in FIG. 3, in accordance with techniques presented herein.

FIG. 7 is a functional block diagram of an electronic device 700, including processing and communications circuitry 702 that includes frequency analysis and/or filtering circuitry 704 according to an embodiment of the present disclosure. The frequency analysis/filtering circuitry 704 may correspond, for example, to embodiments of such circuitry described with reference to FIGS. 2-6 of the present disclosure. The electronic device 700 includes sensors 706 that generate digital sensor signals, which are provided to the processing and communications circuitry 702 for further processing. The frequency analysis/filtering circuitry 704 may generate results based on the digital sensor signals provided from the sensors 706. As discussed elsewhere herein, since the frequency analysis/filtering circuitry 704 utilizes bitwise operations in generating the results, the power consumed by the frequency analysis/filtering circuitry 704 may be significantly reduced relative to a situation where the processing and communications circuitry 702 includes one or more microcontrollers for performing arithmetic or other non-bitwise operations on the digital values received from the sensors 706.

In the depicted embodiment of FIG. 7, the electronic device 700 further includes energy harvesting circuitry 708, which may generate electrical energy for use in powering the electronic device 700. The energy harvesting circuitry 708 may, for example, generate electrical energy from physical movement of the electronic device 700 in situations in which the device is a wearable device. Power management circuitry 710 receives the generated power from the energy harvesting circuitry 708 and controls the storage of this power in an energy storage device 712, such as a battery or capacitor, and the supplying of power to the processing and communication circuitry 702 and sensors 706.

In some embodiments, circuits and devices described herein may include more components than illustrated, may include fewer components than illustrated, may split illustrated components into separate components, may combine illustrated components, etc., and various combinations thereof. For example, in certain embodiments, the digital frequency filter 301 of FIG. 3 may be modified to avoid multiplying bits of input signal 302 by zeros in the encoded pulse trains stored via circular register 306 and output via multiplexer 312, thereby avoiding additional power-consuming clock cycles. In such an embodiment, output from multiplexer 312 may be coupled to a down counter in series with a zero detector, such that with respect to a pulse train comprising n logical-high pulses and m-n logical-low pulses, the clock signal fed to gate blocks 320 is stopped after the n logical-high pulses are completed, and resumed once a next logical-high pulse is detected.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

In at least one embodiment, a circuit may comprise a circular register configured to store a representation of a first encoded sinusoid; a set of multiple logical gate blocks that are each configured to multiply, via one or more bitwise operations, each of multiple bits of a received input signal with a pulse train corresponding to a value of the first encoded sinusoid; and a logic circuit coupled to the circular register and the set of multiple logical gate blocks. The logic circuit may be configured to generate, based on the first encoded sinusoid and on the input signal, an output signal indicating an approximate value of the received input signal multiplied by the first encoded sinusoid.

The representation of the first encoded sinusoid may be a quantized representation of a first reference sinusoid encoded via a plurality of pulse trains, such that each pulse train includes a number of pulses n representing a value of the first reference sinusoid at time t out of a maximum possible pulses m, and such that m represents a quantization level of the first encoded sinusoid.

The logic circuit may comprise an integrator that is configured to provide an output of the circuit comprising integrated results of the multiple logical gate blocks over time.

The circuit may include a second set of multiple logical gate blocks that are each configured to multiply, via one or more bitwise operations, the respective one of the multiple bits of the received input signal with a second pulse train corresponding to a value of a second encoded sinusoid, such that the second encoded sinusoid has a same frequency as the first encoded sinusoid and is out of phase with the first encoded sinusoid. The second encoded sinusoid may be 90° out of phase with the first encoded sinusoid.

The circuit may comprise a sign control block to provide one or more control signals to the set of multiple logical gate blocks based at least in part on a sign of the received input signal and on a sign of the first encoded sinusoid.

Each of the multiple logical gate blocks may, in operation, receive a first clock signal, a respective bit of the received input signal, the pulse train corresponding to a value of the first encoded sinusoid, and a first pair of control signals that are related to a sign of the received input signal and to a sign of the first encoded sinusoid. Each of the multiple logical gate blocks may, in operation, provide a second clock signal based on the first clock signal, on the respective bit of the received input signal, and on the pulse train corresponding to a value of the first encoded sinusoid. Each of the multiple logical gate blocks may, in operation, provide a second pair of control signals based on a logical comparison of the first pair of control signals.

In another embodiment, a device may comprise one or more sensors that, in operation, generate a multi-bit sensor signal; one or more processors; and frequency analysis circuitry communicatively coupled to the one or more sensors and to the one or more processors. The frequency analysis circuitry may include a circular register configured to store a representation of a first encoded sinusoid; a set of multiple logical gate blocks that are each configured to multiply, via one or more bitwise operations, each of multiple bits of the multi-bit sensor signal with a pulse train corresponding to a value of the first encoded sinusoid; and a logic circuit coupled to the circular register and the set of multiple logical gate blocks. The logic circuit may be configured to generate, based on the first encoded sinusoid and on the multi-bit sensor signal, an output signal indicating an approximate value of the received input signal multiplied by the first encoded sinusoid.

The representation of the first encoded sinusoid may be a quantized representation of a first reference sinusoid encoded via a plurality of pulse trains, such that each pulse train includes a number of pulses n representing a value of the first reference sinusoid at time t out of a maximum possible pulses m, and such that m represents a quantization level of the first encoded sinusoid.

The logic circuit may comprise an integrator that is configured to provide an output of the circuit comprising integrated results of the multiple logical gate blocks over time.

The frequency analysis circuitry may comprise a second set of multiple logical gate blocks that are each configured to multiply, via one or more bitwise operations, the respective one of the multiple bits of the multi-bit sensor signal with a second pulse train corresponding to a value of a second encoded sinusoid, such that the second encoded sinusoid has a same frequency as the first encoded sinusoid and is out of phase with the first encoded sinusoid. The second encoded sinusoid may be 90° out of phase with the first encoded sinusoid.

The frequency analysis circuitry may include a sign control block to provide one or more control signals to the set of multiple logical gate blocks based at least in part on a sign of the multi-bit sensor signal and on a sign of the first encoded sinusoid.

Each of the multiple logical gate blocks may, in operation, receive a first clock signal, a respective bit of the multi-bit sensor signal, an encoded bit of the first encoded sinusoid, and a first pair of control signals that are related to a sign of the multi-bit sensor signal and to a sign of the first encoded sinusoid. Each of the multiple logical gate blocks may, in operation, provide a second clock signal based on the first clock signal, on the respective bit of the multi-bit sensor signal, and on the encoded bit of the first encoded sinusoid. Each of the multiple logical gate blocks may, in operation, provide a second pair of control signals based on a logical comparison of the first pair of control signals.

In still another embodiment, a method may comprise storing a representation of a first encoded sinusoid in a first circular register; multiplying, via one or more bitwise operations, each of multiple bits of a received input signal with a pulse train corresponding to a value of the first encoded sinusoid; and generating, based on the first encoded sinusoid and on the received input signal, an output signal indicating an approximate value of the received input signal multiplied by the first encoded sinusoid.

Multiplying each of the multiple bits of the received input signal with the pulse train corresponding to a value of the first encoded sinusoid may include multiplying a respective bit of the received input signal at time t with a pulse train comprising a number of pulses n representing a value of a first reference sinusoid at time t out of a maximum possible pulses m, the maximum possible pulses m representing a quantization level of the first encoded sinusoid.

Generating the output signal based on the first encoded sinusoid and on the received input signal may include generating integrated results of multiplying each of the multiple bits of the received input signal with the pulse train corresponding to a value of the first encoded sinusoid over time.

The method may include multiplying, via one or more bitwise operations, a respective bit of the received input signal with a second pulse train corresponding to a value of a second encoded sinusoid. The second encoded sinusoid may have a same frequency as the first encoded sinusoid and out of phase with the first encoded sinusoid. The second encoded sinusoid may be 90° out of phase with the first encoded sinusoid.

Multiplying each of the multiple bits of the received input signal with a pulse train corresponding to a value of the first encoded sinusoid may include providing one or more control signals based at least in part on a sign of the received input signal and on a sign of the first encoded sinusoid.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A circuit, comprising:
   a circular register configured to store a representation of a first encoded sinusoid;
   a set of multiple logical gate blocks that are each configured to multiply, via one or more bitwise operations, each of multiple bits of a received input signal with a pulse train corresponding to a value of the first encoded sinusoid; and
   a logic circuit coupled to the circular register and the set of multiple logical gate blocks, the logic circuit configured to generate, based on the first encoded sinusoid and on the input signal, an output signal indicating an approximate value of the received input signal multiplied by the first encoded sinusoid.

2. The circuit of claim 1, wherein the representation of the first encoded sinusoid is a quantized representation of a first reference sinusoid encoded via a plurality of pulse trains, wherein each pulse train includes a number of pulses n representing a value of the first reference sinusoid at time t out of a maximum possible pulses m, and wherein m represents a quantization level of the first encoded sinusoid.

3. The circuit of claim 1, wherein the logic circuit comprises an integrator that is configured to provide an output of the circuit comprising integrated results of the multiple logical gate blocks over time.

4. The circuit of claim 1, comprising a second set of multiple logical gate blocks that are each configured to multiply, via one or more bitwise operations, the respective one of the multiple bits of the received input signal with a second pulse train corresponding to a value of a second encoded sinusoid, the second encoded sinusoid having a same frequency as the first encoded sinusoid and being out of phase with the first encoded sinusoid.

5. The circuit of claim 4, wherein the second encoded sinusoid is 90° out of phase with the first encoded sinusoid.

6. The circuit of claim 1, comprising a sign control block to provide one or more control signals to the set of multiple logical gate blocks based at least in part on a sign of the received input signal and on a sign of the first encoded sinusoid.

7. The circuit of claim 1, wherein in operation, each of the multiple logical gate blocks at least:
receives a first clock signal, a respective bit of the received input signal, the pulse train corresponding to a value of the first encoded sinusoid, and a first pair of control signals that are related to a sign of the received input signal and to a sign of the first encoded sinusoid;
provides a second clock signal based on the first clock signal, on the respective bit of the received input signal, and on the pulse train corresponding to a value of the first encoded sinusoid; and
provides a second pair of control signals based on a logical comparison of the first pair of control signals.

8. A device, comprising:
one or more sensors that, in operation, generate a multi-bit sensor signal;
one or more processors; and
frequency analysis circuitry communicatively coupled to the one or more sensors and to the one or more processors, the frequency analysis circuitry including:
a circular register configured to store a representation of a first encoded sinusoid;
a set of multiple logical gate blocks that are each configured to multiply, via one or more bitwise operations, each of multiple bits of the multi-bit sensor signal with a pulse train corresponding to a value of the first encoded sinusoid; and
a logic circuit coupled to the circular register and the set of multiple logical gate blocks, the logic circuit configured to generate, based on the first encoded sinusoid and on the multi-bit sensor signal, an output signal indicating an approximate value of the received input signal multiplied by the first encoded sinusoid.

9. The device of claim 8, wherein the representation of the first encoded sinusoid is a quantized representation of a first reference sinusoid encoded via a plurality of pulse trains, wherein each pulse train includes a number of pulses n representing a value of the first reference sinusoid at time t out of a maximum possible pulses m, and wherein m represents a quantization level of the first encoded sinusoid.

10. The device of claim 8, wherein the logic circuit comprises an integrator that is configured to provide an output of the circuit comprising integrated results of the multiple logical gate blocks over time.

11. The device of claim 8, comprising a second set of multiple logical gate blocks that are each configured to multiply, via one or more bitwise operations, the respective one of the multiple bits of the multi-bit sensor signal with a second pulse train corresponding to a value of a second encoded sinusoid, the second encoded sinusoid having a same frequency as the first encoded sinusoid and being out of phase with the first encoded sinusoid.

12. The circuit of claim 11, wherein the second encoded sinusoid is 90° out of phase with the first encoded sinusoid.

13. The device of claim 8, comprising a sign control block to provide one or more control signals to the set of multiple logical gate blocks based at least in part on a sign of the multi-bit sensor signal and on a sign of the first encoded sinusoid.

14. The device of claim 8, wherein in operation, each of the multiple logical gate blocks at least:
receives a first clock signal, a respective bit of the multi-bit sensor signal, the pulse train corresponding to a value of the first encoded sinusoid, and a first pair of control signals that are related to a sign of the multi-bit sensor signal and to a sign of the first encoded sinusoid;
provides a second clock signal based at least in part on the first clock signal, on the respective bit of the multi-bit sensor signal, and on the pulse train corresponding to a value of the first encoded sinusoid; and
provides a second pair of control signals based at least in part on a logical comparison of the first pair of control signals.

15. A method, comprising:
storing a representation of a first encoded sinusoid in a first circular register;
multiplying, via one or more bitwise operations, each of multiple bits of a received input signal with a pulse train corresponding to a value of the first encoded sinusoid; and
generating, based on the first encoded sinusoid and on the received input signal, an output signal indicating an approximate value of the received input signal multiplied by the first encoded sinusoid.

16. The method of claim 15, wherein multiplying each of the multiple bits of the received input signal with the pulse train corresponding to a value of the first encoded sinusoid includes multiplying a respective bit of the received input signal at time t with a pulse train comprising a number of pulses n representing a value of a first reference sinusoid at time t out of a maximum possible pulses m, the maximum possible pulses m representing a quantization level of the first encoded sinusoid.

17. The method of claim 15, wherein generating the output signal based on the first encoded sinusoid and on the received input signal includes generating integrated results of multiplying each of the multiple bits of the received input signal with the pulse train corresponding to a value of the first encoded sinusoid over time.

18. The method of claim 15, comprising multiplying, via one or more bitwise operations, a respective bit of the received input signal with a second pulse train corresponding to a value of a second encoded sinusoid, the second encoded sinusoid having a same frequency as the first encoded sinusoid and being out of phase with the first encoded sinusoid.

19. The method of claim 18, wherein the second encoded sinusoid is 90° out of phase with the first encoded sinusoid.

20. The method of claim 15, wherein multiplying each of the multiple bits of the received input signal with a pulse train corresponding to a value of the first encoded sinusoid includes providing one or more control signals based at least in part on a sign of the received input signal and on a sign of the first encoded sinusoid.

\* \* \* \* \*